(12) United States Patent
Tsorng et al.

(10) Patent No.: US 11,876,323 B2
(45) Date of Patent: Jan. 16, 2024

(54) ADJUSTABLE PLATE MODULES FOR ALIGNING CONNECTORS

(71) Applicant: QUANTA COMPUTER INC., Taoyuan (TW)

(72) Inventors: Yaw-Tzorng Tsorng, Taoyuan (TW); Jen-Jia Liou, Taoyuan (TW); Chun-Chen Hsu, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 243 days.

(21) Appl. No.: 17/526,977

(22) Filed: Nov. 15, 2021

(65) Prior Publication Data

US 2023/0051326 A1 Feb. 16, 2023

Related U.S. Application Data

(60) Provisional application No. 63/260,309, filed on Aug. 16, 2021.

(51) Int. Cl.
*H01R 13/631* (2006.01)
*H05K 7/14* (2006.01)
*H01R 12/71* (2011.01)
*H05K 1/18* (2006.01)
*H01R 12/70* (2011.01)

(52) U.S. Cl.
CPC ......... *H01R 13/631* (2013.01); *H05K 7/1487* (2013.01); *H01R 12/7088* (2013.01); *H01R 12/716* (2013.01); *H05K 1/18* (2013.01); *H05K 2201/09063* (2013.01); *H05K 2201/10189* (2013.01); *H05K 2201/10409* (2013.01)

(58) Field of Classification Search
CPC .............. H01R 13/631; H01R 12/7088; H01R 12/716; H05K 7/1487; H05K 1/18; H05K 2201/09063; H05K 2201/10189; H05K 2201/10409; H05K 7/1492; H05K 1/181; H05K 7/14325
See application file for complete search history.

(56) References Cited

U.S. PATENT DOCUMENTS 11,183,794 B2 * 11/2021 Sawada ................. H01M 10/63
2014/0223587 A1 * 8/2014 Chen ....................... G06F 21/88
726/35

(Continued)

*Primary Examiner* — Abdullah A Riyami
*Assistant Examiner* — Nader J Alhawamdeh
(74) *Attorney, Agent, or Firm* — NIXON PEABODY LLP

(57) ABSTRACT

A power supply assembly includes a power supply unit disposed within a housing and an adjustable plate module movably disposed on a floor thereof. The adjustable plate module includes a plate, a shaft, a stopper panel, and a compressible device. The plate has two planar surfaces positioned at different heights with respect to the floor. The shaft is fixedly coupled to and extends outwardly from the plate. The shaft is configured to move between a first position and a second position to transition a connector between the planar surfaces. The stopper panel is disposed adjacent to a distal end of the shaft and has an opening therein for accommodating the shaft. The compressible device is disposed around the shaft such that a displacement of the plate causes the compressible device to compress against the stopper panel and facilitate movement of the shaft from the first position to the second position.

20 Claims, 5 Drawing Sheets

(56) References Cited

U.S. PATENT DOCUMENTS

2015/0333446 A1\* 11/2015 Yuan .................... H01R 13/665
439/248
2019/0190203 A1\* 6/2019 Sawada ................ H01R 13/631
2023/0051326 A1\* 2/2023 Tsorng ................. H05K 7/1492

\* cited by examiner

ADJUSTABLE PLATE MODULES FOR ALIGNING CONNECTORS

CROSS-REFERENCE TO RELATED APPLICATIONS

This application claims priority from and benefit of U.S. Provisional Application No. 63/260,309, entitled "The Design of the Mechanism to support different PSU specification in Single System," and filed on Aug. 16, 2021. The contents of that application are hereby incorporated by reference in their entirety.

FIELD OF THE INVENTION

The present invention relates generally to connecting electrical and mechanical components, and more specifically, to a power supply assembly having adjustable plate modules for aligning with mating portions of different connectors.

BACKGROUND OF THE INVENTION

A server is a specialized computer system that includes numerous electrical and mechanical components integrated into a single unit within an electronic chassis. Common to all servers is a motherboard including one or more printed circuit boards (PCB) and panels having electrical and mechanical components, such as a Graphics Processing Unit (GPU) or a Central Processing Unit (CPU), memory device slots (e.g., DDR3, DDR4, DRAM), PCIe slots), hard drives, a power supply, and peripherals (e.g., universal serial bus [USB] ports, local area network [LAN], and other input-output [I/O] ports). The PCBs and panels are installed on various assembly boards. It is desirable to have adjustable plate modules that enable alignment between mating portions of connectors of the different electrical and mechanical components.

SUMMARY OF THE INVENTION

The term embodiment and like terms, e.g., implementation, configuration, aspect, example, and option, are intended to refer broadly to all of the subject matter of this disclosure and the claims below. Statements containing these terms should be understood not to limit the subject matter described herein or to limit the meaning or scope of the claims below. Embodiments of the present disclosure covered herein are defined by the claims below, not this summary. This summary is a high-level overview of various aspects of the disclosure and introduces some of the concepts that are further described in the Detailed Description section below. This summary is not intended to identify key or essential features of the claimed subject matter. This summary is also not intended to be used in isolation to determine the scope of the claimed subject matter. The subject matter should be understood by reference to appropriate portions of the entire specification of this disclosure, any or all drawings, and each claim.

According to certain aspects of the present disclosure, a power supply assembly configured to connect with a connector, is disclosed. The power supply assembly includes a housing, a power supply unit disposed within the housing, and an adjustable plate module movably disposed on a floor of the housing adjacent to a bottom surface of the power supply unit. The adjustable plate module includes a plate, a shaft, a stopper panel, and a compressible device. The plate is movably mounted to the floor and has two planar surfaces positioned at different heights with respect to the floor. The shaft is fixedly coupled to and extends outwardly from the plate. The shaft is configured to move between a first position and a second position to transition the connector between the two planar surfaces for mating with the power supply unit. The stopper panel is disposed adjacent to a distal end of the shaft and has an opening therein for accommodating the shaft. The compressible device is disposed around the shaft such that a displacement of the plate causes the compressible device to compress against the stopper panel and facilitate movement of the shaft from the first position to the second position.

According to certain aspects of the present disclosure, the two planar surfaces are generally horizontal.

According to certain aspects of the present disclosure, the plate includes a first horizontal surface and a second horizontal surface, wherein the first horizontal surface and the second horizontal surface are positioned at different heights with respect to the floor and joined by a sloped surface.

According to certain aspects of the present disclosure, the second horizontal surface is positioned at a predetermined height above the first horizontal surface.

According to certain aspects of the present disclosure, the plate further comprises one or more slots through either one or both planar surfaces, wherein each of the one or more slots is configured to accommodate displacement of a screw therein corresponding to the displacement of the plate.

According to certain aspects of the present disclosure, the plate is formed from a plastic material.

According to certain aspects of the present disclosure, the stopper panel is formed from a sheet metal.

According to certain aspects of the present disclosure, the compressible device is a mechanical spring.

According to certain aspects of the present disclosure, the shaft is integrally formed on the plate.

According to certain aspects of the present disclosure, the plate further includes a vertically-oriented collar portion for applying a force thereon to enable the displacement of the plate.

According to certain aspects of the present disclosure, a difference in height between the two planar surfaces depends on a difference in height between a mating portion of the connector and a corresponding mating portion of the power supply unit.

According to certain aspects of the present disclosure, an electronic assembly includes a power supply unit and an adjustable plate module. The power supply unit is disposed within a housing and has a first connector. The adjustable plate module is movably disposed on a floor of the housing adjacent to a bottom surface of the power supply unit. The adjustable plate module includes a plate, a shaft, a stopper panel, and a compressible device. The plate is movably mounted to the floor and has two planar surfaces positioned at different heights with respect to the floor. The shaft is fixedly coupled to and extends outwardly from the plate. The shaft is configured to move between a first position and a second position to transition a second connector between the two planar surfaces for mating with the first connector. The stopper panel is disposed adjacent to a distal end of the shaft and has an opening therein for accommodating the shaft. The compressible device is disposed around the shaft such that a displacement of the plate causes the compressible device to compress against the stopper panel and facilitate movement of the shaft from the first position to the second position.

According to certain aspects of the present disclosure, the electronic assembly further includes a printed circuit board having the second connector configured to mate with the first connector.

According to certain aspects of the present disclosure, the printed circuit board further includes one or more oval-shaped apertures through which the printed circuit board is fastened to a bracket. The one or more oval-shaped apertures are configured to enable the printed circuit board to move vertically up and down to adjust a mating position of the second connector with the first connector.

According to certain aspects of the present disclosure, a difference in height between the two planar surfaces depends on a difference in height between the first connector and the second connector.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims. Additional aspects of the disclosure will be apparent to those of ordinary skill in the art in view of the detailed description of various embodiments, which is made with reference to the drawings, a brief description of which is provided below.

BRIEF DESCRIPTION OF THE DRAWINGS

The disclosure, and its advantages and drawings, will be better understood from the following description of representative embodiments together with reference to the accompanying drawings. These drawings depict only representative embodiments, and are therefore not to be considered as limitations on the scope of the various embodiments or claims.

Figure 1B:
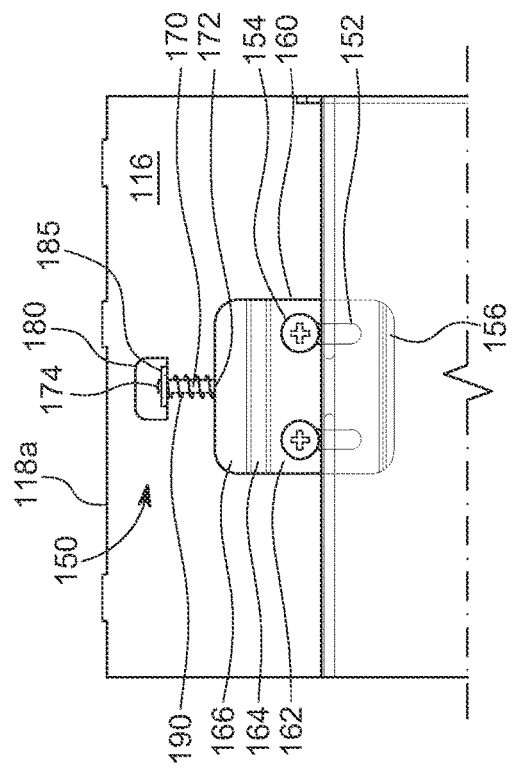
FIG. 1B shows a top view of the adjustable plate module in an initial position of a compressible device, according to certain aspects of the present disclosure.

The present disclosure is susceptible to various modifications and alternative forms, and some representative embodiments have been shown by way of example in the drawings and will be described in detail herein. It should be understood, however, that the invention is not intended to be limited to the particular forms disclosed. Rather, the disclosure is to cover all modifications, equivalents, and alternatives falling within the spirit and scope of the invention as defined by the appended claims.

DETAILED DESCRIPTION

Embodiments of the disclosure are directed to a power supply assembly having adjustable plate modules for aligning with mating portions of different connectors. Each adjustable plate module includes a plate having planar surfaces at different heights, a shaft fixedly coupled to and extending outwardly from the plate, a stopper panel for accommodating the shaft upon forward displacement, and a compressible device disposed around the shaft. A collar-portion of the adjustable plate module can be pressed by a connector towards an opposing connector such that displacement of the plate towards the opposing connector enables compression of the compressible device and subsequent vertical displacement of the opposing connector.

Various embodiments are described with reference to the attached figures, where like reference numerals are used throughout the figures to designate similar or equivalent elements. The figures are not necessarily drawn to scale and are provided merely to illustrate aspects and features of the present disclosure. Numerous specific details, relationships, and methods are set forth to provide a full understanding of certain aspects and features of the present disclosure, although one having ordinary skill in the relevant art will recognize that these aspects and features can be practiced without one or more of the specific details, with other relationships, or with other methods. In some instances, well-known structures or operations are not shown in detail for illustrative purposes. The various embodiments disclosed herein are not necessarily limited by the illustrated ordering of acts or events, as some acts may occur in different orders and/or concurrently with other acts or events. Furthermore, not all illustrated acts or events are necessarily required to implement certain aspects and features of the present disclosure.

For purposes of the present detailed description, unless specifically disclaimed, and where appropriate, the singular includes the plural and vice versa. The word "including" means "including without limitation." Moreover, words of approximation, such as "about," "almost," "substantially," "approximately," and the like, can be used herein to mean "at," "near," "nearly at," "within 3-5% of," "within acceptable manufacturing tolerances of," or any logical combination thereof. Similarly, terms "vertical" or "horizontal" are intended to additionally include "within 3-5% of" a vertical or horizontal orientation, respectively. Additionally, words of direction, such as "top," "bottom," "left," "right," "above," and "below" are intended to relate to the equivalent direction as depicted in a reference illustration; as understood contextually from the object(s) or element(s) being referenced, such as from a commonly used position for the object(s) or element(s); or as otherwise described herein.

Figure 1C:
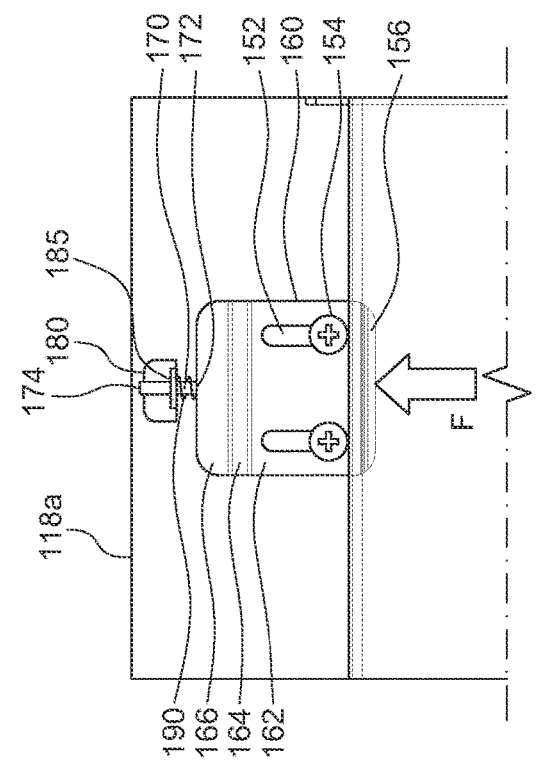
FIG. 1C shows a top view of the adjustable plate module in a final position of the compressible device, according to certain aspects of the present disclosure.
Figure 1A:
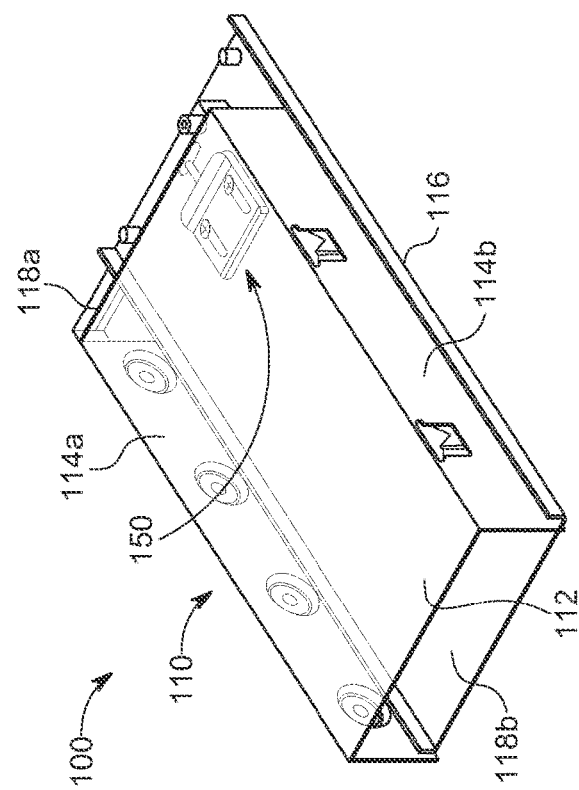
FIG. 1A shows a rear perspective view of a power supply assembly having an adjustable plate module, according to certain aspects of the present disclosure.

Referring to the figures, FIG. 1A shows a rear perspective view of a power supply assembly 100 having an adjustable plate module 150. The power supply assembly 100 includes a housing 110 and a power supply unit (e.g., the power supply unit 420 in FIGS. 4A-4B) disposed within the housing 110. In the non-limiting embodiment of FIG. 1A, the housing 110 has a ceiling 112, a left sidewall 114a, a right sidewall 114b, a floor 116, a front wall 118a, and a rear wall 118b. The adjustable plate module 150 is disposed on the floor 116 of the housing 110. The adjustable plate module 150 may be disposed anywhere on the floor 116 on a location, as needed for aligning mating portions of connectors on or outside the housing 110. In the non-limiting embodiment of FIG. 1A, the adjustable plate module 150 is disposed adjacent to a bottom surface of the power supply unit configured to connect to a printed circuit board (e.g., the printed circuit board 230 in FIGS. 2A-2C).

FIGS. 1B-1C show top views of the adjustable plate module 150 as it moves on the floor 116 of the housing 110 between an initial position and a final position. The adjustable plate module 150 includes a plate 160, a shaft 170 coupled to the plate 160, a stopper panel 180, and a compressible device 190 disposed around the shaft 170.

The plate 160 may be formed from a plastic or metallic material. The plate 160 has a first horizontal surface 162 and a second horizontal surface 166 positioned at different heights with respect to the floor 116. The difference in height between the first horizontal surface 162 and the second horizontal surface 166 depends on a difference in height between corresponding mating portions of the connectors that are connected using the adjustable plate module 150. The first horizontal surface 162 and the second horizontal surface 166 are joined by a sloped surface 164.

In some non-limiting embodiments, such as shown in FIGS. 1B-1C, the second horizontal surface 166 is positioned in front of the first horizontal surface 162 at a predetermined height above the first horizontal surface 162. The predetermined height may be equal to a difference in height between a connector of the power supply unit and a mating portion of the connector for connecting to the power supply unit, using the adjustable plate module 150.

In some non-limiting embodiments, such as shown in FIGS. 1B-1C, the plate 160 includes one or more slots 152 having a fixed screw 154 movably disposed therein. The slots 152 may be positioned through the first horizontal surface 162 as in FIGS. 1B-1C, or the second horizontal surface 166, or both. Each of the slots 152 is long enough to accommodate displacement of the fixed screw 154 therein, which corresponds to the displacement of the plate 160, when the adjustable plate module 150 moves upon application of a force F.

In some non-limiting embodiments, such as shown in FIGS. 1B-1C, the plate 160 includes a vertically-oriented collar portion 156. The collar portion 156 is used to apply the force F which enables the displacement of the plate 160.

The shaft 170 extends outwards from the plate 160. The shaft 170 has a proximal end 172 and a distal end 174. The proximal end 172 is adjacent to the second horizontal surface 166. In some embodiments, the shaft 170 is coupled to the plate 160 at the proximal end 172. In other embodiments, the shaft 170 is integrally formed on the plate 160.

The stopper panel 180 is generally disposed adjacent to the distal end 174 of the shaft 170. In some embodiments, the stopper panel 180 may be formed from a sheet metal or a free-cutting steel such as, but not limited to, stainless steel, carbon steel, and the like. The stopper panel 180 has an opening 185 for accommodating the shaft 170. In some embodiments, the opening 185 has a diameter or thickness that is just enough for the shaft 170 to be inserted therethrough.

The compressible device 190 is disposed around the shaft 170. In some embodiments, such as shown in FIGS. 1B-1C, the compressible device 190 is a mechanical spring. The compressible device 190 is configured to compress against walls of the stopper panel 180 around the opening 185, when the plate 160 is displaced forward to the final position (FIG. 1C). Accordingly, the compressible device 190 decompresses when the plate 160 returns to the initial position (FIG. 1B).

During operation, application of the force F on the collar portion 156 presses the plate 160 and the shaft 170 forward from the initial position to the final position. The shaft 170 moves into the opening 185 of the stopper panel 180, while the compressible device 190 around the shaft 170 compresses against the walls of the stopper panel 180 around the opening 185. The resultant movement of the plate 160 also moves the slots 152 forward along the fixed screws 154 by a distance equal to the distance moved forward by the plate 160 and the shaft 170. The movement of the plate 160 and the shaft 170 enables alignment of height between a connector of the power supply unit and a mating portion of the connector for connecting to the power supply unit, as further explained below.

Figure 2B:
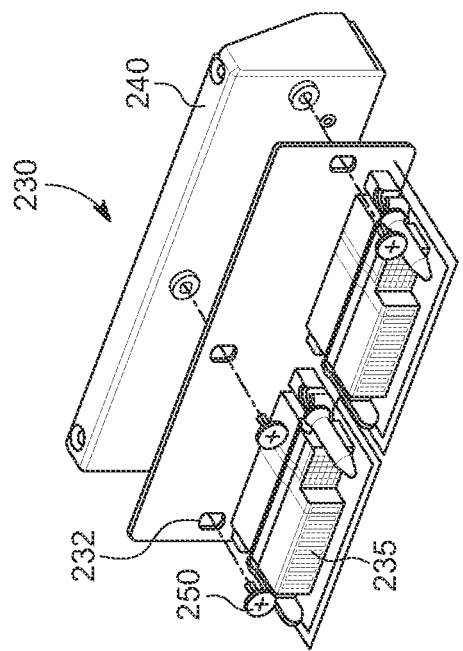
FIG. 2B shows a front perspective view of the PCB assembly of FIG. 2A, according to certain aspects of the present disclosure.
Figure 2A:
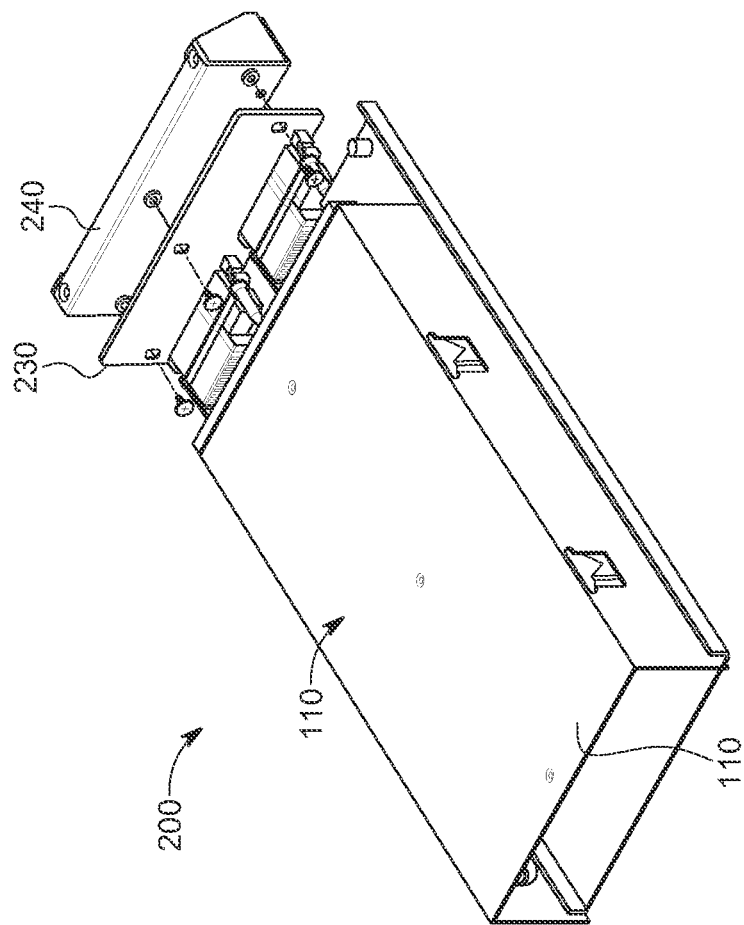
FIG. 2A shows a rear perspective view of the power supply assembly of FIG. 1A connecting to a printed circuit board (PCB) assembly, according to certain aspects of the present disclosure.

FIG. 2A shows a rear perspective view of the power supply assembly 100 connecting to a printed circuit board (PCB) 230 to form an electronic assembly 200. As discussed above, the power supply assembly 100 includes the housing 110 within which a power supply unit (e.g., the power supply unit 420 in FIGS. 4A-4B) is disposed. The connection between the power supply assembly 100 and the PCB 230 transmits power to the components of the PCB 230 for operation of the electronic assembly 200.

FIG. 2B shows a front perspective view of the PCB 230. The PCB 230 includes a connector 235 for connecting to a connector (e.g., the connector 425) of the power supply unit in the power supply assembly 100. The PCB 230 is coupled to a PCB bracket 240 using one or more fasteners 250 fixed to the PCB bracket 240. Each fastener 250 passes through one or more oval-shaped apertures 232 on the PCB 230. Each of the oval-shaped apertures 232 enables the fastener 250 to slide along its length, and thereby allows the PCB 230 to move vertically up and down to adjust the mating position of the connector 235.

Figure 3A:
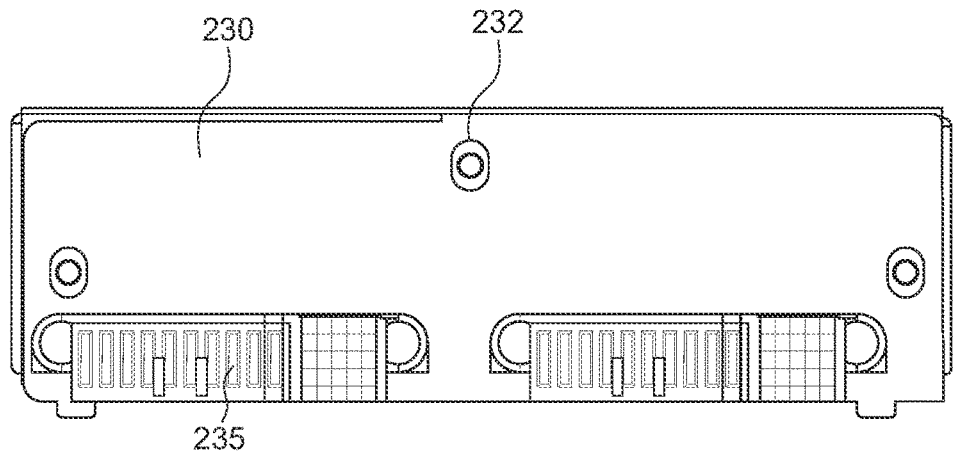
FIG. 3A shows a front view of the PCB assembly of FIG. 2A, according to certain aspects of the present disclosure.
Figure 3B:
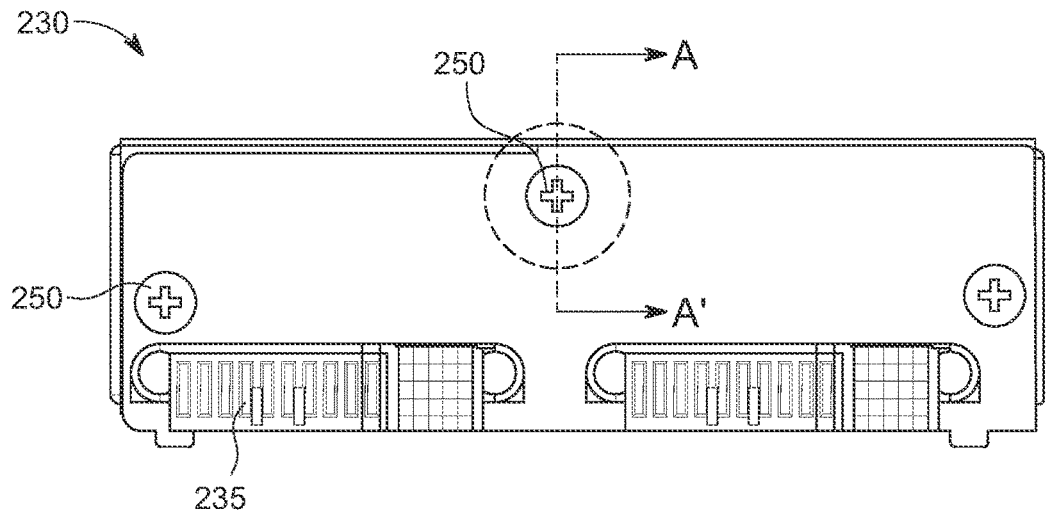
FIG. 3B shows a front view of the PCB assembly of FIG. 2A coupled to the PCB bracket, according to certain aspects of the present disclosure.
Figure 3C:
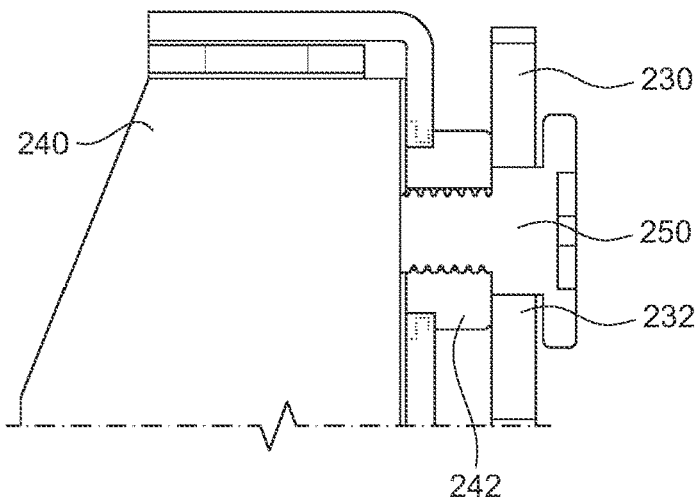
FIG. 3C shows a side view of the view of the PCB assembly of FIG. 2A coupled to a PCB bracket, according to certain aspects of the present disclosure.

FIG. 3A shows a front view of the PCB 230, which illustrates the connector 235 and the oval-shaped apertures 232 on the PCB 230 with greater clarity and detail. FIGS. 3B-3C show a front view and a side view, respectively, of the PCB 230 coupled to the PCB bracket 240. As discussed above, the PCB 230 is coupled to the PCB bracket 240 using the fasteners 250 through the oval-shaped apertures 232. While the oval-shaped apertures 232 enable the PCB 230 to move vertically up and down, the fasteners 250 are fixed to the PCB bracket 240 through a nut 242.

Figure 4A:
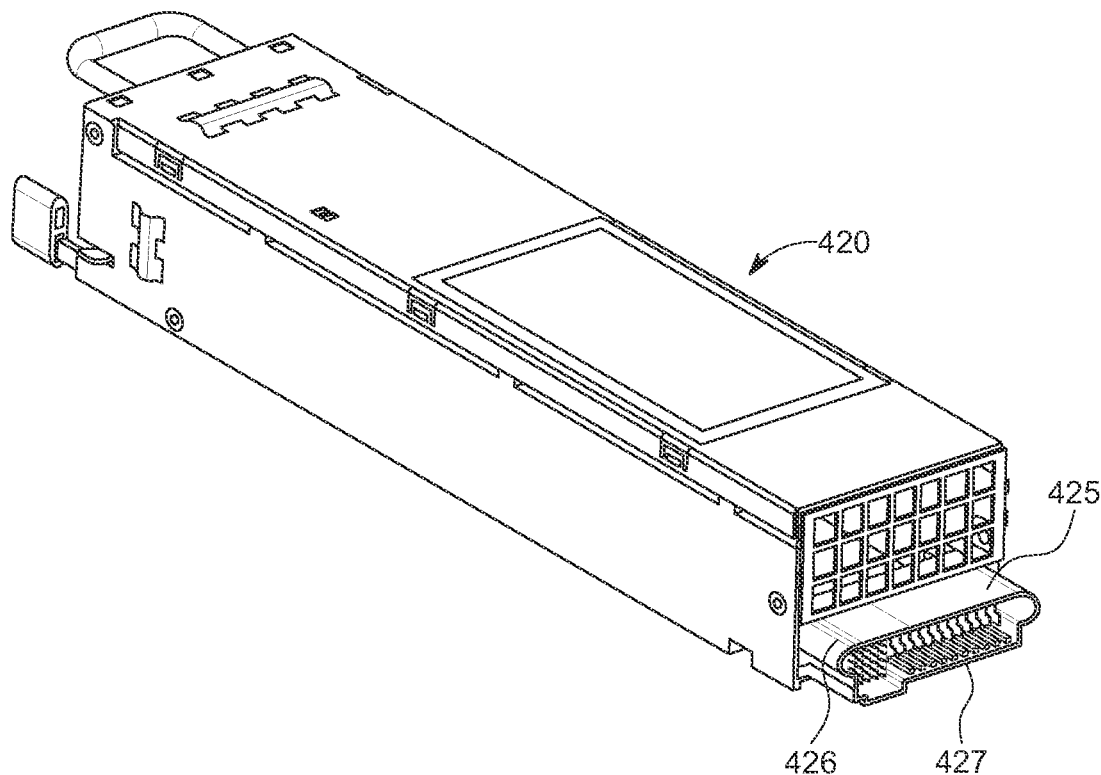
FIG. 4A shows a perspective view of a power supply unit configured to be positioned in the power supply assembly of FIG. 1A, according to certain aspects of the present disclosure.
Figure 4B:
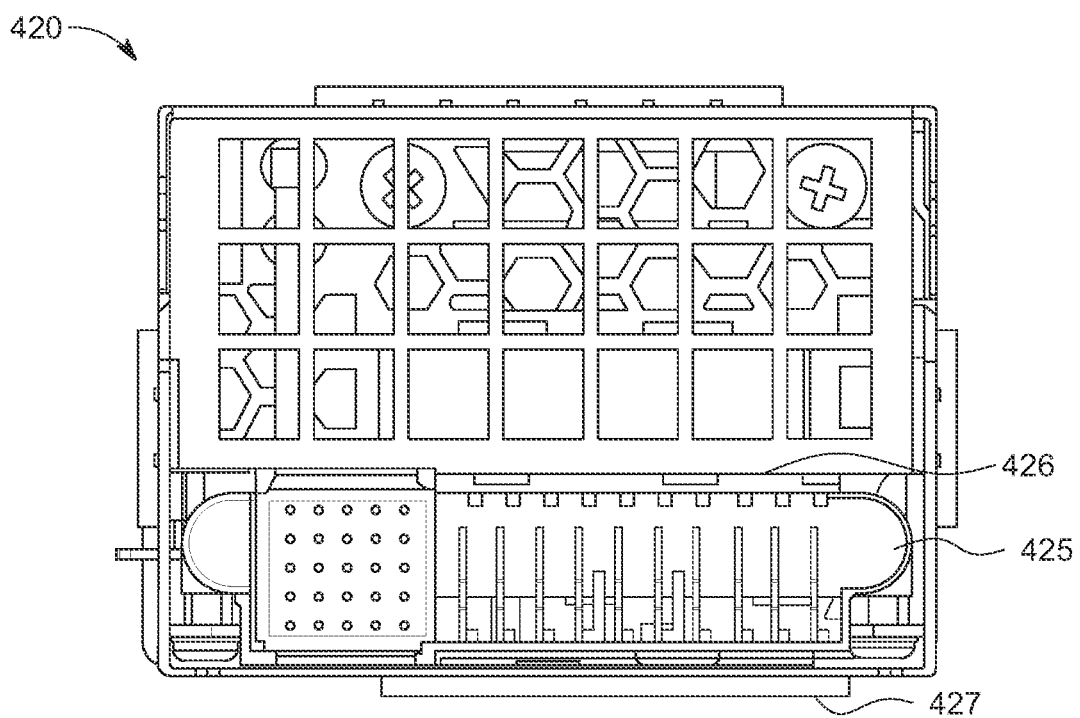
FIG. 4B shows a front view of the power supply unit of FIG. 5A, according to certain aspects of the present disclosure.

FIGS. 4A-4B show a perspective view and a front view, respectively, of a power supply unit 420 configured to be positioned in the power supply assembly 100. The power supply unit 420 includes a connector 425 configured to connect with an opposing connector, such as the connector 235 of the PCB 230. The connector 425 has a top surface 426 and a bottom surface 427. As discussed above, the bottom surface 427 of the connector 425 is configured to press against the collar portion 156 of the adjustable plate module 150 of FIGS. 1A-1C, in order to vertically align the connector 425 with a mating portion of the opposing connector, i.e., the mating portion of the connector 235 of the PCB 230.

Figure 5A:
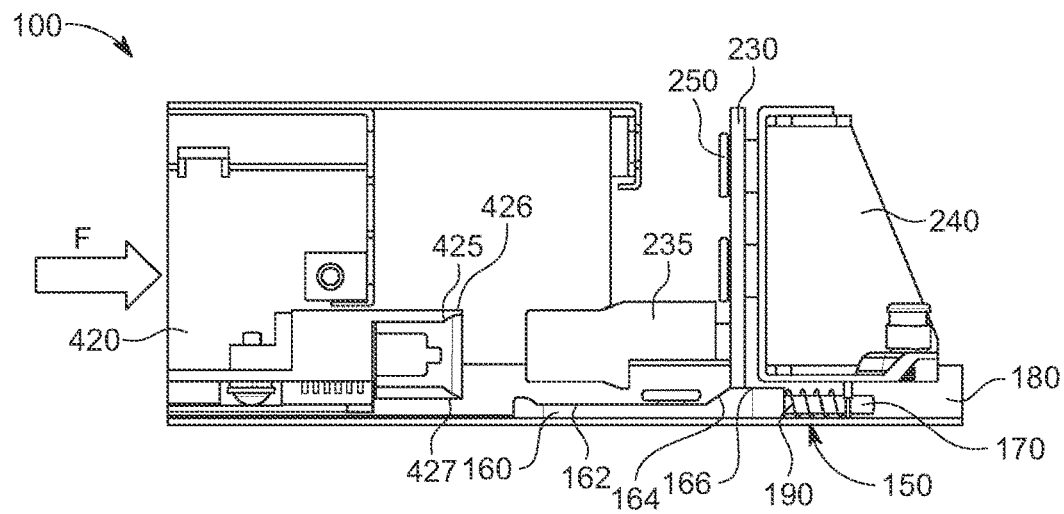
FIG. 5A shows a side view of the power supply assembly of FIG. 1A before connecting with the PCB assembly of FIG. 2A to form an electronic assembly, according to certain aspects of the present disclosure.

FIG. 5A shows a side view of the power supply assembly 100 before connecting with the PCB 230 to form the electronic assembly 200. The power supply assembly 100 includes the power supply unit 420. The power supply unit 420 has the connector 425 with the top surface 426 and the bottom surface 427. The PCB 230 is coupled to the PCB bracket 240 through the fasteners 250, as discussed above. The connector 425 is configured to mate with the connector 235 of the PCB 230, but is positioned at different heights with respect to the floor 116. The adjustable plate module 150 enables the connector 235 to align in height with the connector 425 for connection.

Figure 5B:
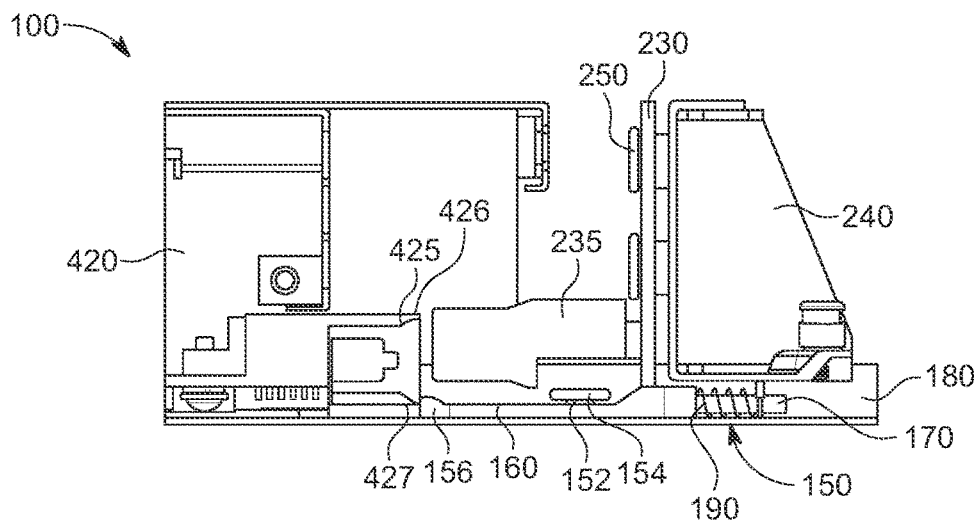
FIG. 5B shows a side view of an initial position of the power supply assembly of FIG. 1A as it connects with the PCB assembly of FIG. 2A, according to certain aspects of the present disclosure.

FIG. 5B shows a side view of an initial position of the power supply assembly 100 as it connects with the PCB 230, upon application of the force F applied by the bottom surface 427 on the collar portion 156 of the adjustable plate module 150. The force F presses the plate 160 and the shaft 170 of the adjustable plate module 150 forward. At the same time, the slots 152 move forward along the fixed screws 154 by a distance equal to the distance moved forward by the plate 160 and the shaft 170.

Figure 5C:
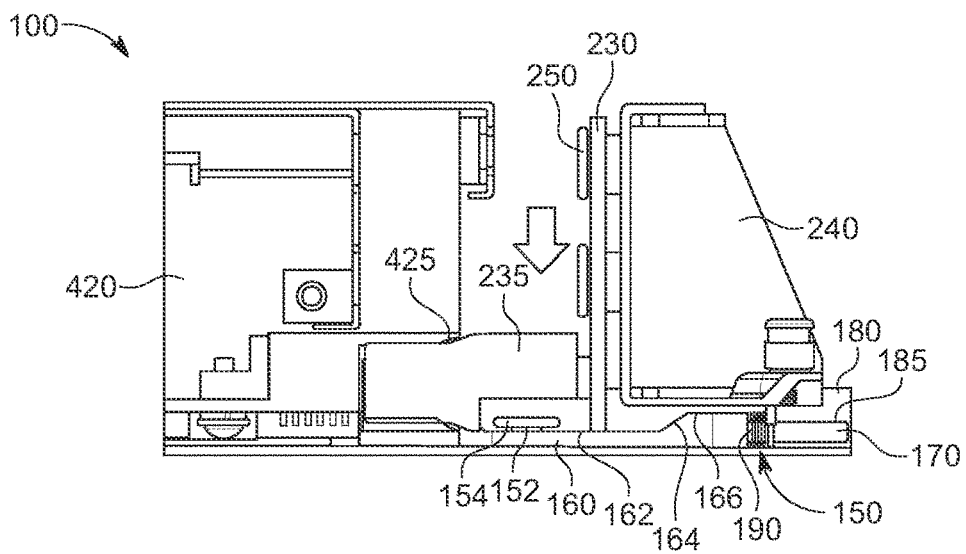
FIG. 5C shows a side view of a final position of the power supply assembly of FIG. 1A after it connects with the PCB assembly of FIG. 2A, according to certain aspects of the present disclosure.

FIG. 5C shows a side view of a final position of the power supply assembly 100 after it connects with the PCB 230. At this position, the shaft 170 is inserted into the opening 185, while the compressible device 190 is compressed against the walls of the stopper panel 180 around the opening 185. This results in the PCB 230 moving from the second horizontal surface 166 of the plate 160, along the sloped surface 164 of the plate 160, and to the first horizontal surface 162 of the plate 160. Accordingly, the connector 235 of the PCB 230 becomes aligned to mate with the connector 425 of the power supply unit 420, with the help of the adjustable plate module 150.

Embodiments of the adjustable plate modules described herein can be advantageously used to align mating portions of connectors of different heights. In particular, a power supply unit of a server can be easily connected and secured to a PCB board or another panel using the adjustable plate modules, if the mating portions of the corresponding connectors are at different heights. Accordingly, the adjustable plate modules can support a variety of power supply units for mating with connectors at different heights.

Although the disclosed embodiments have been illustrated and described with respect to one or more implementations, equivalent alterations and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

While various embodiments of the present disclosure have been described above, it should be understood that they have been presented by way of example only, and not limitation. Numerous changes to the disclosed embodiments can be made in accordance with the disclosure herein, without departing from the spirit or scope of the disclosure. Thus, the breadth and scope of the present disclosure should not be limited by any of the above described embodiments. Rather, the scope of the disclosure should be defined in accordance with the following claims and their equivalents.

What is claimed is:

1. A power supply assembly configured to connect with a connector, the power supply assembly comprising:
a housing;
a power supply unit disposed within the housing; and
an adjustable plate module movably disposed on a floor of the housing adjacent to a bottom surface of the power supply unit, the adjustable plate module including:
a plate movably mounted to the floor and having two planar surfaces positioned at different heights with respect to the floor;
a shaft fixedly coupled to and extending outwardly from the plate, the shaft configured to move between a first position and a second position to transition the connector between the two planar surfaces for mating with the power supply unit;
a stopper panel disposed adjacent to a distal end of the shaft and having an opening therein for accommodating the shaft; and
a compressible device disposed around the shaft such that a displacement of the plate causes the compressible device to compress against the stopper panel and facilitate movement of the shaft from the first position to the second position.

2. The power supply assembly of claim 1, wherein the two planar surfaces are generally horizontal.

3. The power supply assembly of claim 1, wherein the plate includes a first horizontal surface and a second horizontal surface, wherein the first horizontal surface and the second horizontal surface are positioned at different heights with respect to the floor and joined by a sloped surface.

4. The power supply assembly of claim 3, wherein the second horizontal surface is positioned at a predetermined height above the first horizontal surface.

5. The power supply assembly of claim 1, wherein the plate further comprises one or more slots through either one or both planar surfaces, each of the one or more slots configured to accommodate displacement of a screw therein corresponding to the displacement of the plate.

6. The power supply assembly of claim 1, wherein the plate is formed from a plastic material.

7. The power supply assembly of claim 1, wherein the stopper panel is formed from a sheet metal.

8. The power supply assembly of claim 1, wherein the compressible device is a mechanical spring.

9. The power supply assembly of claim 1, wherein the shaft is integrally formed on the plate.

10. The power supply assembly of claim 1, wherein the plate further comprises a vertically-oriented collar portion for applying a force thereon to enable the displacement of the plate.

11. The power supply assembly of claim 1, wherein a difference in height between the two planar surfaces depends on a difference in height between a mating portion of the connector and a corresponding mating portion of the power supply unit.

12. An electronic assembly comprising:
a power supply unit disposed within a housing and having a first connector; and
an adjustable plate module movably disposed on a floor of the housing adjacent to a bottom surface of the power supply unit, the adjustable plate module including:
   a plate movably mounted to the floor and having two planar surfaces positioned at different heights with respect to the floor;
   a shaft fixedly coupled to and extending outwardly from the plate, the shaft configured to move between a first position and a second position to transition a second connector between the two planar surfaces for mating with the first connector;
   a stopper panel disposed adjacent to a distal end of the shaft and having an opening therein for accommodating the shaft; and
   a compressible device disposed around the shaft such that a displacement of the plate causes the compressible device to compress against the stopper panel and facilitate movement of the shaft from the first position to the second position.

13. The electronic assembly of claim 12, further comprising:
   a printed circuit board having the second connector configured to mate with the first connector.

14. The electronic assembly of claim 13, wherein the printed circuit board further comprises one or more oval-shaped apertures through which the printed circuit board is fastened to a bracket, the one or more oval-shaped apertures configured to enable the printed circuit board to move vertically up and down to adjust a mating position of the second connector with the first connector.

15. The electronic assembly of claim 12, wherein the two planar surfaces are generally horizontal.

16. The electronic assembly of claim 12, wherein the plate includes a first horizontal surface and a second horizontal surface, wherein the first horizontal surface and the second horizontal surface are positioned at different heights with respect to the floor and joined by a sloped surface.

17. The electronic assembly of claim 16, wherein the second horizontal surface is positioned at a predetermined height above the first horizontal surface.

18. The electronic assembly of claim 12, wherein the plate further comprises one or more slots through either one or both planar surfaces, each of the one or more slots configured to accommodate displacement of a screw therein corresponding to the displacement of the plate.

19. The electronic assembly of claim 12, wherein the plate further comprises a vertically-oriented collar portion for applying a force thereon to enable the displacement of the plate.

20. The electronic assembly of claim 12, wherein a difference in height between the two planar surfaces depends on a difference in height between the first connector and the second connector.

\* \* \* \* \*